US008621751B2

(12) United States Patent
Cheng et al.

(10) Patent No.: US 8,621,751 B2
(45) Date of Patent: Jan. 7, 2014

(54) INKJET HEAD MANUFACTURING METHOD

(75) Inventors: Chiang-Ho Cheng, Hsinchu (TW); Ke-Ming Huang, Hsinchu (TW); Wen-Ti Lo, Hsinchu (TW); Hsien-Chung Tai, Hsinchu (TW); Kwo-Yuan Shi, Hsinchu (TW)

(73) Assignee: Microjet Technology Co., Ltd, Hsinchu (TW)

( * ) Notice: Subject to any disclaimer, the term of this patent is extended or adjusted under 35 U.S.C. 154(b) by 223 days.

(21) Appl. No.: 13/219,386

(22) Filed: Aug. 26, 2011

(65) Prior Publication Data

US 2012/0055021 A1 Mar. 8, 2012

(30) Foreign Application Priority Data

Sep. 8, 2010 (CN) .......................... 2010 1 0282112
Sep. 20, 2010 (CN) .......................... 2010 1 0293467
Sep. 20, 2010 (CN) .......................... 2010 1 0293469

(51) Int. Cl.
*B21D 53/76* (2006.01)
*B23P 17/00* (2006.01)
*H01L 41/22* (2013.01)
*H04R 17/00* (2006.01)

(52) U.S. Cl.
USPC .......................................... 29/890.1; 29/25.35

(58) Field of Classification Search
USPC ..................... 29/890.1, 25.35; 347/20, 40, 44
See application file for complete search history.

(56) References Cited

U.S. PATENT DOCUMENTS 5,872,583 A 2/1999 Yamamoto et al.
5,872,584 A * 2/1999 Hauck et al. .................... 347/86
6,134,761 A * 10/2000 Usui ............................ 29/25.35
6,137,513 A * 10/2000 Pawlowski et al. ............. 347/86
6,637,869 B2 * 10/2003 Seto ................................ 347/70
6,712,454 B2 * 3/2004 Okuda ............................ 347/65
6,715,862 B2 * 4/2004 Takagi et al. ................... 347/72
6,863,387 B2 * 3/2005 Thielman et al. ............... 347/86
6,964,472 B2 * 11/2005 Takagi et al. ................... 347/72
7,108,360 B2 * 9/2006 Lu et al. .......................... 347/71
7,219,428 B2 * 5/2007 Ito ................................ 29/890.1
7,246,889 B2 * 7/2007 Kanada et al. .................. 347/71
7,338,151 B1 * 3/2008 Samura ........................... 347/70
7,422,313 B2 * 9/2008 Umeda et al. ................... 347/57
7,814,656 B2 * 10/2010 Prasad ......................... 29/890.1
2007/0275542 A1 * 11/2007 Takahashi ..................... 438/460

FOREIGN PATENT DOCUMENTS

CN 1280061 A 1/2001
CN 1754701 4/2006
CN 101549583 A 10/2009
TW 553837 9/2003
TW 200516009 8/2004
TW I220416 8/2004
TW I228780 3/2005
TW I288117 10/2007
TW 200947542 11/2009

* cited by examiner

*Primary Examiner* — David Angwin

(57) ABSTRACT

An inkjet head manufacturing method includes the following steps. Firstly, a multilayered structure with a plurality of microstructure layers is provided. The alignment check holes of the microstructure layers are concentric and have different diameters. Then, the microstructure layers are stacked together and the microstructure layers are aligned with each other according to the concentric and different-diameter alignment check holes, wherein a dry film layer is sandwiched between every two adjacent microstructure layers. The preset slots of the microstructure layers are collectively defined as inlet flow channels, ink chambers, pressure cavities and outlet flow channels. Then, the multilayered structure is assembled and positioned through the dry film layers by a thermal compression process. Then, a cutting knife is used to linearly cut the actuator plate over a spacer between every two adjacent pressure cavities and along a path parallel with rims of the pressure cavities.

10 Claims, 12 Drawing Sheets

INKJET HEAD MANUFACTURING METHOD

FIELD OF THE INVENTION

The present invention relates to a piezoelectric inkjet technology, and more particularly to an inkjet head manufacturing method by utilizing a piezoelectric inkjet technology.

BACKGROUND OF THE INVENTION

With increasing development of an inkjet technology, the inkjet technology is not only used in the traditional printer market but also used in flat panel displays and semiconductor manufacturing processes in recent years. However, for reducing the fabricating cost and saving the process time, researchers are seeking new inkjet technologies. As known, a piezoelectric inkjet technology is one of the most widely-used new inkjet technologies.

Please refer to FIGS. 1A, 1B and 1C. The inkjet head manufactured by the conventional piezoelectric inkjet technology has a multilayered structure 1. The multilayered structure 1 is formed by perform a metal fusion bonding process to stack several layers of stainless steel plates. The multilayered structure 1 comprises a plurality of inkjet units 10. Each inkjet unit 10 comprises an inlet flow channel 101 for introducing an ink liquid, an ink chamber 102 for storing the ink liquid, a pressure cavity 103, an outlet flow channel 104, a nozzle hole 105 and other microstructures. In addition, a vibration film plate 106 is disposed over the inlet flow channel 101, the ink chamber 102, the pressure cavity 103, the outlet flow channel 104 and the nozzle hole 105 of each inkjet unit 10. Corresponding to the location of the pressure cavity 103, an actuator plate 107 is disposed over the vibration film plate 106. Since the inkjet unit 10 is formed by stacking several layers of stainless steel plates, the dimension precision of fabricating the stainless steel plates should meet with stringent requirements. Moreover, during the process of assembling these stainless steel plates, the assembling error should be controlled to be lower than an acceptable level. If the assembling error is too high, the outlet flow channel 104 corresponding to the nozzle hole 105 is readily blocked. In addition, the nozzle hole 105 is usually produced by etching a nozzle hole plate with a thickness smaller than 200 micrometer and a tolerance around 10 micrometer, the edge size of the nozzle hole plate is readily changed because of etchant concentration, etching time or other parameters. Due to the assembling error of assembling so many layers of stainless steel plates, the nozzle hole 105 is prone to dislocation. That is, the location of the nozzle hole 105 is deviated. Under this circumstance, the outlet flow channel 104 is shrunken and becomes non-upright, and thus it is difficult to eject the ink. In addition, since the ink droplets of the ink liquid are not uniformly-sized, the printing quality is deteriorated.

The conventional inkjet unit 10 is assembled by the metal fusion bonding process. Hereinafter, the process of assembling the conventional inkjet unit 10 will be illustrated as follows. Firstly, the surfaces of the stainless steel plates are plated with gold. Then, these plates are successively stacked together in the predetermined order. Then, a thermal compression process is performed to diffuse the gold atoms between every two adjacent plates. Afterwards, the fusion bonding action of these plates is completed. Although this assembling process has good bonding efficacy, there are still some drawbacks. For example, since the fusion bonding process is carried out at a high temperature (e.g. 500~1000° C.) under the anaerobic environment, it is difficult and expensive to install the equipment. In addition, the heating jig for facilitating thermal compression should be carefully selected. If the heating jig is not proper, the heating jig is easily suffered from deformation, degradation or even crack. That is, since the heating jig is severely cracked or adhered, the depletion rate is very fast. In addition to the high replacement cost of the heating jig, the mass production quality is unstable. As known, gold is increasingly expensive, the fusion bonding process is not easily in a batch-wise manner, and the fusion bonding efficacy and yield are affected by the surface treatment. Due to these reasons, the fabricating cost of producing the inkjet units by the metal fusion bonding process is gradually increased.

After the actuator plate 107 is stacked as the uppermost layer of the multilayered structure 1, the actuator plate 107 is cut according to the profile of the pressure cavity 103. The resulting structure of the inkjet head with a plurality of inkjet units 10 is shown in FIG. 1B. During the process of cutting the actuator plate 107 of the multilayered structure 1, the inkjet units 10 are classified into a first inkjet unit group 11 and a second inkjet unit group 12. The inkjet units 10 of the first inkjet unit group 11 and the second inkjet unit group 12 are arranged in a staggered form. In addition, the pressure cavity of each inkjet units 10 in the actuator plate 107 has a rectangular rim 133.

Generally, the actuator plate 107 is cut by a laser cutting process. Please refer to FIG. 1D, which schematically illustrates the multilayered structure of a conventional inkjet head before a laser cutting process is performed. For performing the laser cutting process, the rectangular rims 133 of the inkjet units 10 of the first inkjet unit group 11 and the second inkjet unit group 12 should be precisely positioned one by one. Then, the actuator plate 107 is cut into a plurality of small actuator pieces corresponding to the locations of the pressure cavities 103 of respective inkjet units 10. During the laser cutting process is performed, the cutting positions should be precisely controlled and the power needs to homogenized, the rectangular rims 133 of the inkjet units 10 should be precisely aligned, and the cutting depth and width should be precisely controlled. If the cutting depth is too large, the vibration film plate 106 underlying the actuator plate 107 is possibly damaged. Whereas, if the width is improperly controlled, the adjacent inkjet units 10 are adversely affected. Consequently, before the laser cutting process is performed, the laser wavelength, energy, duration and other parameters should be preset in order to achieve the desired size of the actuator plate 107. In other words, before the laser cutting process is performed, it is time-consuming and complicated to set these cutting parameters.

For producing the plurality of actuator pieces by the laser cutting process, the rectangular rims 133 are cut one by one. Since the inkjet units 10 of the first inkjet unit group 11 and the second inkjet unit group 12 are arranged in a staggered form, the laser cutting action needs to be stopped whenever one of the rectangular rims 133 is cut. The next laser cutting action is done when the next rectangular rim 133 is aligned. Since it takes much time to repeatedly align the start point of each actuator pieces, the conventional process of cutting the actuator plate 107 is very long. Moreover, since the cutting speeds at the start point, end point or the turning portion are different, the non-homogeneous power usually results in uneven cutting depth, low yield and high cost.

Moreover, the laser machine is more expensive than other cutting machines. If the laser power is unstable during the laser cutting process is performed, a great deal of heat will be generated. Under this circumstance, the magnetic flux intensity and the physical intensity of the actuator plate 107 are adversely affected.

Therefore, there is a need of providing an improved method of manufacturing an inkjet head so as to obviate the drawbacks encountered from the prior art.

SUMMARY OF THE INVENTION

The present invention provides an inkjet head manufacturing method for solving the problems arising from the metal fusion bonding process and solving the problems of setting the laser wavelength, energy, duration and other parameters before the laser cutting process is performed. By the manufacturing process of the present invention, the assembling error arising from the etchant concentration, etching time or other parameters during the process of producing the nozzle hole will be minimized. Since the misalignment problem of the assembled inkjet unit is reduced, the size of the ink droplets of the ink liquid becomes more uniform, and the printing quality will be enhanced.

In accordance with an aspect of the present invention, there is provided an inkjet head manufacturing method. The inkjet head manufacturing method includes steps of: (a) providing a multilayered structure with a plurality of microstructure layers, wherein a plurality of slots and a plurality of alignment check holes are formed in each microstructure layer, wherein the alignment check holes of the microstructure layers are concentric and have different diameters; (b) stacking the microstructure layers together and aligning the microstructure layers with each other according to the concentric and different-diameter alignment check holes, wherein a dry film layer is sandwiched between every two adjacent microstructure layers, wherein the preset slots of the microstructure layers are collectively defined as inlet flow channels, ink chambers, pressure cavities and outlet flow channels, wherein the pressure cavities are symmetrical and parallel with each other; (c) fixing the aligned multilayered structure by a heating jig, and assembling and positioning the multilayered structure through the dry film layers by a thermal compression process; (d) attaching an actuator plate on the multilayered structure at positions corresponding to the symmetrical and parallel pressure cavities, and using a cutting knife to linearly cut the actuator plate over a spacer between every two adjacent pressure cavities and along a path parallel with rims of the pressure cavities, thereby producing an inkjet head with a plurality of symmetrical inkjet units.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
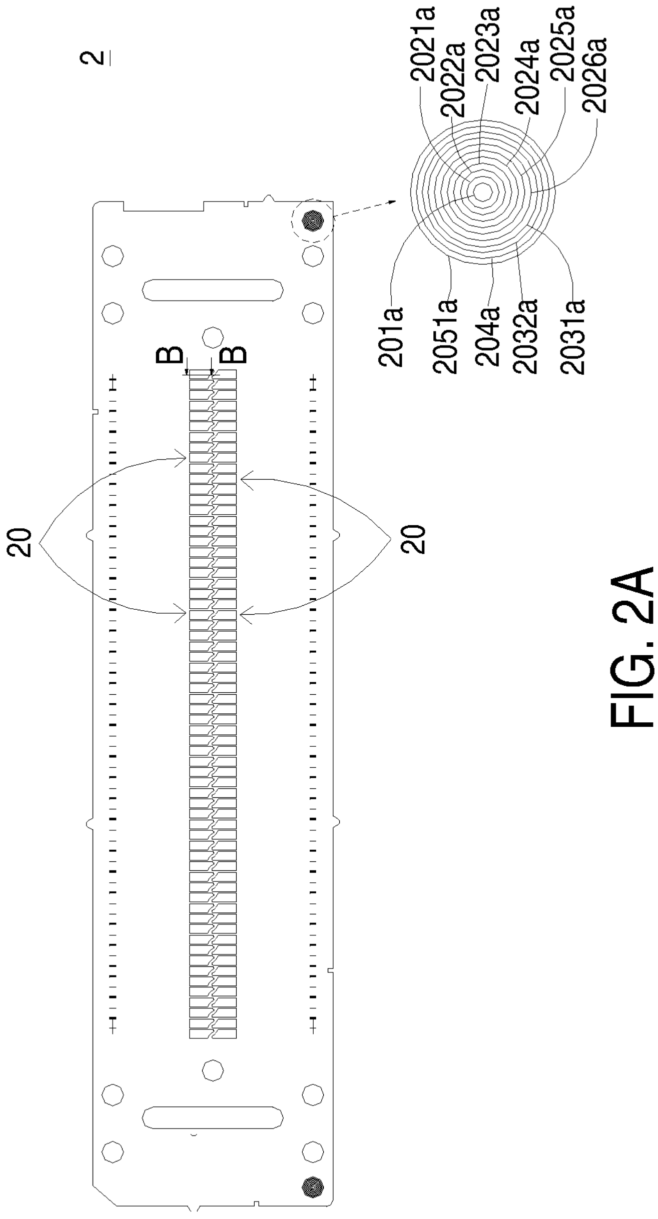
FIG. 2A schematically illustrates an inkjet head structure according to a first embodiment of the present invention.
Figure 2B:
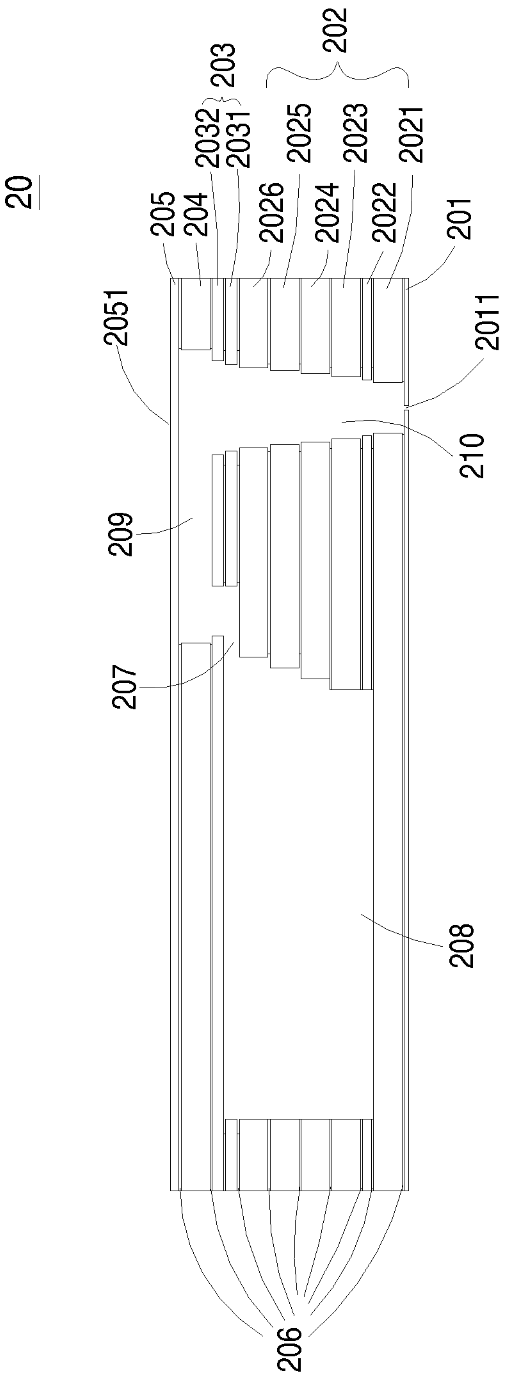
FIG. 2B is a schematic cross-sectional view illustrating the inkjet head structure of FIG. 2A and taken along the line B-B.

FIG. 2A schematically illustrates an inkjet head structure according to a first embodiment of the present invention. FIG. 2B is a schematic cross-sectional view illustrating the inkjet head structure of FIG. 2A and taken along the line B-B. Please refer to FIGS. 2A and 2B. The inkjet head structure 2 comprises a plurality of inkjet units 20, which are symmetrical and parallel with each other. The inkjet unit 20 has a multilayered structure comprising a plurality of microstructure layers in a stack arrangement, wherein a dry film layer is sandwiched between every two adjacent microstructure layers. Each inkjet unit 20 comprises a nozzle hole layer 201, an intermediate flow channel layer 202, a communication layer 203, a pressure cavity layer 204, an actuator layer 205 in a stack arrangement. In addition, a dry film layer 206 is sandwiched between every two adjacent layers.

A method of manufacturing an inkjet head structure will be illustrated in more details as follows.

Firstly, in the step (a), a multilayered structure with a plurality of microstructure layers is provided, wherein a plurality of slots and a plurality of alignment check holes are formed in each microstructure layer. In addition, the alignment check holes of the microstructure layers are concentric and have different diameters.

Please refer to FIG. 2B again. The multilayered structure comprises a nozzle hole layer 201, an intermediate flow channel layer 202, a communication layer 203, a pressure cavity layer 204 and an actuator layer 205. The nozzle hole layer 201 has a nozzle hole 2011 and a plurality of alignment check holes 201*a*. The intermediate flow channel layer 202 comprises a first plate 2021, a second plate 2022, a third plate 2023, a fourth plate 2024, a fifth plate 2025 and a sixth plate 2026. Similarly, a plurality of slots (e.g. the slots 208 and 210 as shown in FIG. 2B) and a plurality of alignment check holes 2021*a*, 2022*a*, 2023*a*, 2024*a*, 2025*a* and 2026*a* are formed in these plates 2021~2026. The communication layer 203 comprises an inlet flow layer 2031 and a communication hole layer 2032. Similarly, a plurality of slots (e.g. the slots 207 and 210 as shown in FIG. 2B) and a plurality of alignment check holes 2031*a* and 2032*a* are formed in the inlet flow layer 2031 and the communication hole layer 2032. A slot (e.g. the slot 209 as shown in FIG. 2B) and a plurality of alignment check holes 204*a* are formed in the pressure cavity layer 204. The actuator layer 205 comprises a vibration film plate 2051 and an actuator plate. For clarification and brevity, the actuator plate is described in the later step and shown in FIG. 3A, but the actuator plate is not shown in FIG. 2B. Similarly, a plurality of alignment check holes 2051*a* are formed in the vibration film plate 2051.

In an embodiment, the nozzle hole 2011 of the nozzle hole layer 201 is produced by a micro-electroforming process. Since the nozzle hole layer 201 has a large dimension and is made of metallic material, the nozzle hole layer 201 is readily suffered from wrinkles or deformation or sometime unable to restore the original state. In some embodiment, the nozzle hole layer 201 is made of polyimide (PI) because polyimide is difficultly suffered from deformation. Moreover, if the nozzle hole layer 201 is made of polyimide (PI), the nozzle hole 2011 of the nozzle hole layer 201 may be produced by an excimer laser process, wherein the thickness thereof is 25 micrometer or 50 micrometer. Regardless of whether the nozzle hole layer 201 is produced by the micro-electroforming process or the excimer laser process (PI nozzle hole layer), the size of the nozzle hole layer 201 is reduced. In such way, the possibility of causing wrinkles or deformation will be minimized. Since the area is reduced, the fabricating cost is decreased.

In this embodiment, the intermediate flow channel layer 202 and the communication layer 203 are stainless steel plates. Moreover, in the multilayered configuration, the alignment check holes 201*a*, 2021*a*, 2022*a*, 2023*a*, 2024*a*, 2025*a*, 2026*a*, 2031*a*, 2032*a*, 204*a* and 2051*a* are concentric and have different diameters. As shown in FIG. 2A and in the ascending order, the alignment check hole 201*a* of the nozzle hole layer 201, the alignment check hole 2021*a* of the first plate 2021, the alignment check hole 2022*a* of the second plate 2022, the alignment check hole 2023*a* of the third plate 2023, the alignment check hole 2024*a* of the fourth plate 2024, the alignment check hole 2025*a* of the fifth plate 2025, the alignment check hole 2026*a* of the sixth plate 2026, the alignment check hole 2031*a* of the inlet flow layer 2031, the alignment check hole 2032*a* of the communication hole layer 2032, the alignment check hole 204*a* of the pressure cavity layer 204 and the alignment check hole 2051*a* of the vibration film plate 2051 are sequentially shown. That is, the alignment check hole 2051*a* of the vibration film plate 2051 has the largest diameter, and the alignment check hole 201*a* of the nozzle hole layer 201 has the smallest diameter.

Firstly, in the step (b), the microstructure layers are stacked together and aligned with each other by using the concentric and different-diameter alignment check holes. In addition, a dry film layer is sandwiched between every two adjacent microstructure layers. Consequently, the preset slots of these microstructure layers are collectively defined as inlet flow channels, ink chambers, pressure cavities and outlet flow channels, wherein the pressure cavities are symmetrical and parallel with each other.

Please refer to FIG. 2A again. The alignment check holes 201*a*, 2021*a*, 2022*a*, 2023*a*, 2024*a*, 2025*a*, 2026*a*, 2031*a*, 2032*a*, 204*a* and 2051*a* of the microstructure layers are concentric and have different diameters. By utilizing the alignment check holes, these microstructure layers may be aligned with each other. That is, after these microstructure layers are stacked together, the misalignment problem will be avoided. Moreover, as shown in FIG. 2B, a dry film layer 206 is sandwiched between every two adjacent microstructure layers. In this embodiment, after a dry film layer 206 is sandwiched between the first plate 2021 of the intermediate flow channel layer 202 and the nozzle hole layer 201, several dry film layers 206 are sequentially and respectively sandwiched between two adjacent ones of the second plate 2022, the third plate 2023, the fourth plate 2024, the fifth plate 2025 and the sixth plate 2026, and thus the flow channel layer 202 is produced. Then, an additional dry film layer 206 is sandwiched between the sixth plate 2026 of the intermediate flow channel layer 202 and the inlet flow layer 2031 of the communication layer 203, and a further dry film layer 206 is sandwiched between the communication hole layer 2032 and the inlet flow layer 2031 so as to produce the communication layer 203. After the intermediate flow channel layer 202 and the communication layer 203 are stacked together, the preset slots are collectively defined as inlet flow channels 207, ink chambers 208 and outlet flow channels 210. Moreover, a dry film layer 206 is sandwiched between the pressure cavity layer 204 and communication hole layer 2032 of the communication layer 203, and an additional dry film layer 206 is sandwiched between the actuator layer 205 and the pressure cavity layer 204. After the communication layer 203, the pressure cavity layer 204 and the actuator layer 205 are stacked together and the pressure cavity layer 204 is capped by the vibration film plate 2051 of the actuator layer 205, the preset slots are collectively defined as pressure cavities 209. In such way, a channel structure is formed within the multilayered configuration. Moreover, the pressure cavities 209 are symmetrical and parallel with each other.

In this embodiment, the dry film layer 206 is made of photosensitive resist material. For example, the dry film layer 206 is acrylic dry film layer (i.e. acrylic resin) with an aqueous solvent resistant property, or an epoxy dry film layer (i.e. epoxy resin) for solvent and curable ink. The dry film layers 206 may be used as bonding layers. Moreover, for complying with the flow channels or slots overlying or underlying the dry film layers 206, suitable slots may be defined in the dry film layers 206 by a photolithography process.

In this embodiment, the preset slots of the plates of the intermediate flow channel layer 202 and the communication layer 203 are collectively defined as the outlet flow channels 210, which are tapered flow channel structures. As shown in FIG. 2B, the areas of the slots in the intermediate flow channel layer 2032 and the inlet flow layer 2031 of the communication layer 203 and the plates 202~62021 of the intermediate flow channel layer 202 are gradually reduced in the direction from the pressure cavity 209 to the nozzle hole 2011. Along the tapered direction, the flow channel area of the upstream microstructure layer is larger than the flow channel area of the adjacent downstream microstructure layer. That is, the areas of the slots for the outlet flow channel 210 are arranged in descending order: the inlet flow layer 2031, the intermediate flow channel layer 2032, the sixth plate 2026, the fifth plate 2025, the fourth plate 2024, the third plate 2023, the second plate 2022 and the first plate 2021. That is, the slot in the inlet flow layer 2031 has the largest area, and the slot in the first plate 2021 has the smallest area. Since the areas of the outlet flow channel 210 are gradually reduced in the direction from the pressure cavity 209 to the nozzle hole 2011, the tapered flow channel structure of the outlet flow channel 210 may guide the ink liquid along a flowing direction at an accelerated flow speed. Moreover, due to the tapered flow channel structure of the outlet flow channel 210, uniformly-sized ink droplets of the ink liquid can be quickly ejected out of the nozzle hole 2011.

Then, in the step (c), the aligned multilayered structure is fixed by a heating jig, and the multilayered structure is assembled and positioned through the dry film layers by a thermal compression process.

After the multilayered structure is fixed by the heating jig, the bottom layer and the top layer of the multilayered structure are subject to thermal treatment and pressured treatment (i.e. a thermal compression process) at the temperature in the range of about 150 to 200° C. and under the pressure of 3~6 kg/cm$^2$ for about 1 hour. Until the temperature is cooled down to about room temperature under the pressured condition, the multilayered structure is assembled and positioned through the dry film layers.

Afterwards, in the step (d), an actuator plate is attached on the multilayered structure at the positions corresponding to the symmetrical and parallel pressure cavities. Then, a cutting knife is used to linearly cut the actuator plate over a spacer between every two adjacent pressure cavities and along a path parallel with rims of said pressure cavities. Afterwards, the inkjet head with a plurality of symmetrical inkjet units is produced.

Figure 3A:
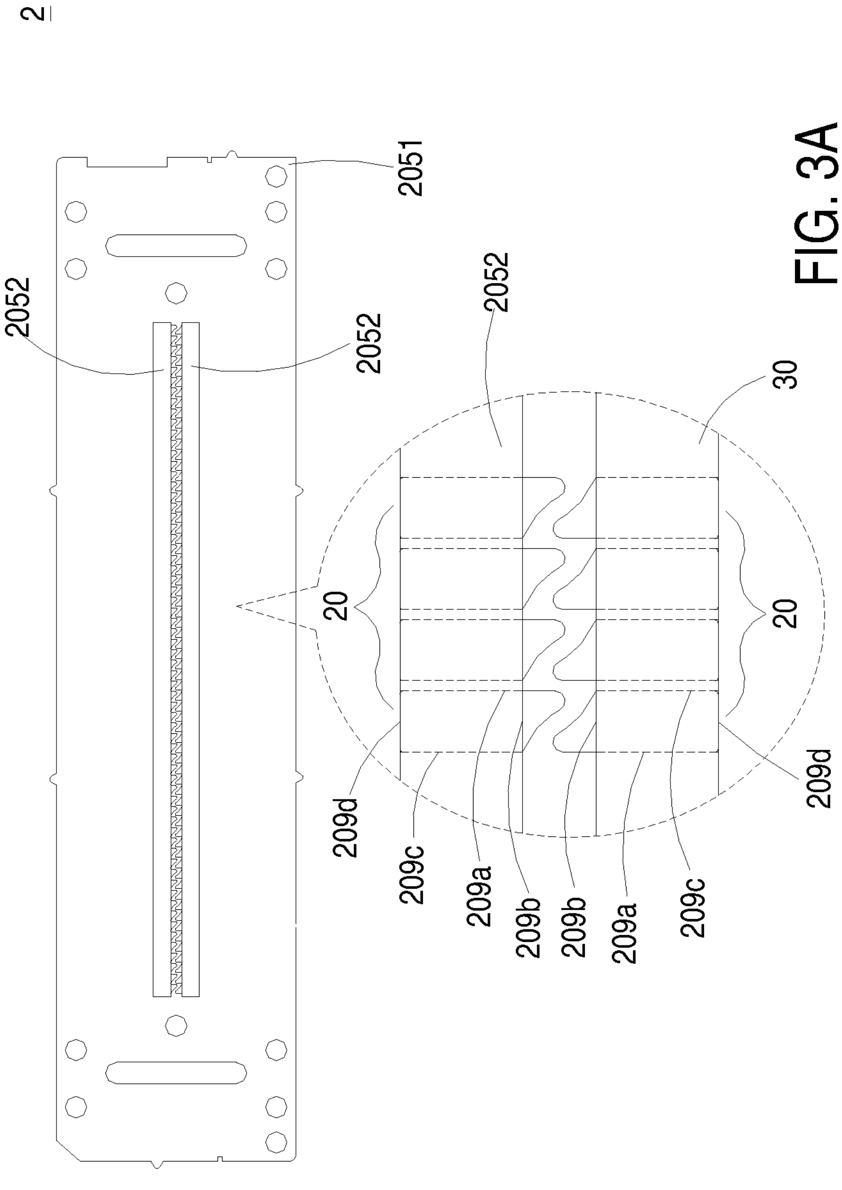
FIG. 3A schematically illustrates the path of cutting the actuator plate according to the first embodiment of the present invention.

As shown in FIG. 3A, the actuator layer 205 comprises a vibration film plate 2051 and an actuator plate 2052. The actuator plate 2052 is attached on the vibration film plate 2051. In an embodiment, the actuator plate 2052 is made of piezoelectric material such as lead zirconate titanate (PZT). After the actuator plate 2052 is attached on the vibration film plate 2051, the locations of the actuator plate 2052 correspond to the plurality of pressure cavities 209. In addition, each pressure cavity 209 has a rectangular shape, and having a first rim 209*a*, a second rim 209*b*, a third rim 209*c* and a fourth rim 209*d*. The first rim 209*a* of one pressure cavity 209 is aligned with the pressure cavity 209 of a symmetrical pressure cavity 209 (see the enlarged portion of FIG. A). That is, after the actuator plate 2052 is attached on the vibration film plate 2051, the first rim 209*a*, the second rim 209*b*, the third rim 209*c* and the fourth rim 209*d* of each pressure cavity 209 are collectively defined as a virtual rectangle. These virtual rectangles are symmetrical and parallel with each other. By using a cutting knife to linearly cut the actuator plate 205 at the region over a spacer between every two adjacent pressure cavities 209 along a path parallel with the rim 209*a* of one pressure cavity 209 and the rim 209*c* of a corresponding pressure cavity 209, an inkjet head with a plurality of symmetrical and parallel inkjet units 20 is produced. In such way, the cutting time period and the cutting path of using the cutting knife are reduced, and the cutting process is more time-saving. Moreover, since the actuator plate is linearly cut by the cutting knife, the cutting process of the present invention is time-saving and cost-effective when compared with the conventional laser cutting process required to repeatedly align the rectangular rims and preset the cutting parameters.

Moreover, the process of using the cutting knife to cut the actuator plate may be performed in an air-cooled or gas-cooled environment. Consequently, the cutting process is maintained at a uniform temperature below 100° C. Under this circumstance, the problems of deteriorating the magnetic flux intensity and the physical intensity of the actuator plate because of unstable laser power during the conventional laser cutting process is performed will be avoided. According to the present invention, the actuator plate 2052 is cut by a cutting knife. The thickness of the cutting knife is dependent on the thickness of the actuator plate 2052. Preferably, the thickness of the cutting knife is smaller than the thickness of the actuator plate 2052. In an embodiment, the thickness of the cutting knife is 50 micrometer.

Figure 3B:
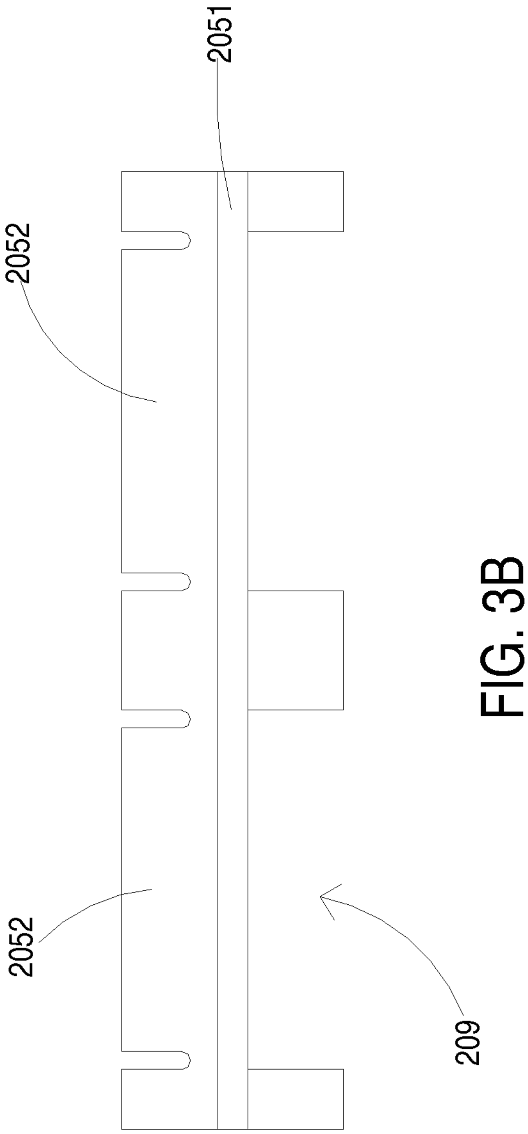
FIG. 3B is a schematic cross-sectional view illustrating the actuator plate after being cut by a cutting knife according to the first embodiment of the present invention.

Please refer to FIG. 3B. After the cutting process is performed, the actuator plate 2052 is not completely disconnected. Consequently, by changing an electric field applied to each actuator plate 2052, the vibration film plate 2051 is correspondingly moved, and the volume of the pressure cavity 209 is correspondingly changed. In a case that the ink liquid stored within the ink chambers 208 is introduced to the pressure cavity 209 through the inlet flow channels 207, the ink fluid is compressed by the pressure cavity 209. Consequently, the ink fluid is forced to flow toward the outlet flow channel 210, and then ejected out through the nozzle hole 2011 to perform an inkjet printing task.

From the above discussion, the inkjet head manufacturing method of the present invention can be produced in a batch-wise manner by a single thermal compression process. However, if the layer number of the inkjet unit is too large, some problems possibly occur. For example, since the thermal conduction become unstable, the bonding efficacy is impaired and the alignment error between adjacent layers is increased. Under this circumstance, the stability of the inkjet printing task is adversely affected. Moreover, before the thermal compression process is performed, the pretreatment (e.g. fabrication of the microstructure layers, application of dry film layers and the fixture of all microstructure layers by the heating jig) is very complicated. The complicated pretreatment may increase the material cost and time cost. For solving these drawbacks, numerous embodiments of the inkjet head manufacturing method are provided.

Figure 4:
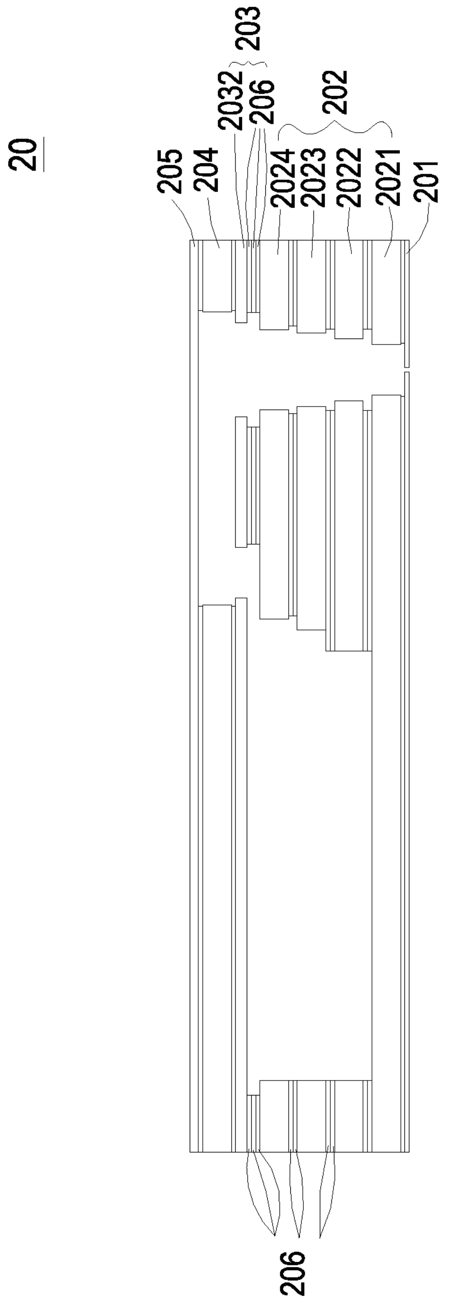
FIG. 4 schematically illustrates an inkjet head structure according to a second embodiment of the present invention.

FIG. 4 schematically illustrates an inkjet head structure according to a second embodiment of the present invention. For comparing the inkjet head structure of this embodiment with the multilayered structure of FIG. 2B, the actuator plate is not shown. In this embodiment, the dry film layers 206 having specified thickness, and a multilayered dry film layer 206 is disposed on some of the plates. In such way, the number of the plates of the inkjet unit 20 will be reduced, and the overall thickness is close to the multilayered structure of the above embodiment. For example, if the thickness of the dry film layer 206 is 30 micrometer, the intermediate flow channel layer 202 has two plates less than the intermediate flow channel layer 202 as shown in FIG. 2B. The lost part may be complemented with the dry film layer 206. Please refer to FIG. 4 again. The intermediate flow channel layer 202 comprises a first plate 2021, a second plate 2022, a third plate 2023 and a fourth plate 2024. A two-layered dry film layer 206 is sandwiched between every two adjacent ones of these plates. Moreover, the inlet flow layer 2031 as shown in FIG. 2B is replaced by a three-layered dry film layer 206. Consequently, the layer number of the inkjet unit 20 may be reduced from 11 to 8 while the overall thickness of the inkjet unit 20 is substantially unchanged.

Figure 5:
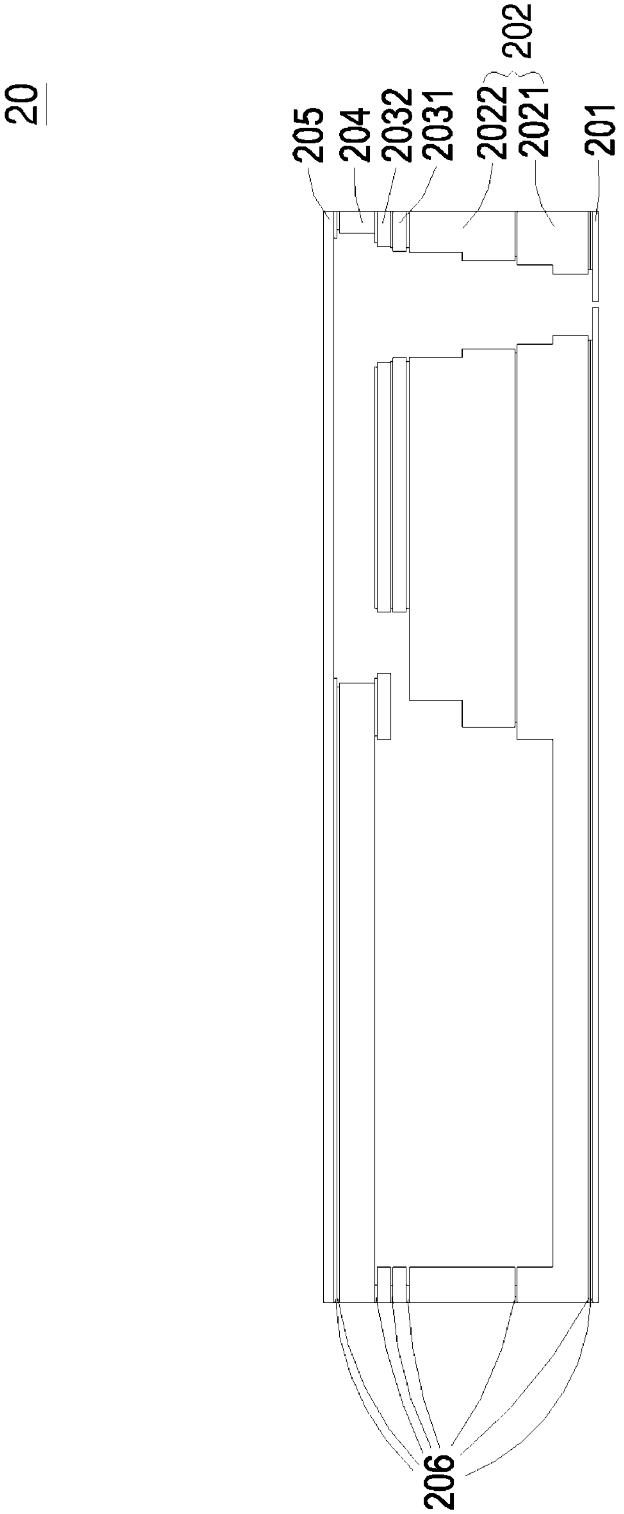
FIG. 5 schematically illustrates an inkjet head structure according to a third embodiment of the present invention.

FIG. 5 schematically illustrates an inkjet head structure according to a third embodiment of the present invention. For comparing the inkjet head structure of this embodiment with the multilayered structure of FIG. 2B, the actuator plate is not shown. For reducing the number of the plates of the inkjet unit 20, the lower-precision plates (i.e. the first plate 2021, the second plate 2022, the third plate 2023, the fourth plate 2024, the fifth plate 2025 and the sixth plate 2026 of the intermediate flow channel layer 202) as shown in FIG. 2B may be consolidated into two layers of plates. As shown in FIG. 5, the intermediate flow channel layer 202 of this embodiment comprises a first plate 2021 and a second plate 2022. On the other hand, the higher-precision layers (e.g. the nozzle hole layer 201, the inlet flow layer 2031 and the intermediate flow channel layer 2032 of the communication layer 203, the pressure cavity layer 204 and the actuator layer 205 as shown in FIG. 3B) are maintained in the multilayered structure of this embodiment. Consequently, the layer number of the inkjet unit 20 may be reduced from 11 to 7.

Figure 1A:
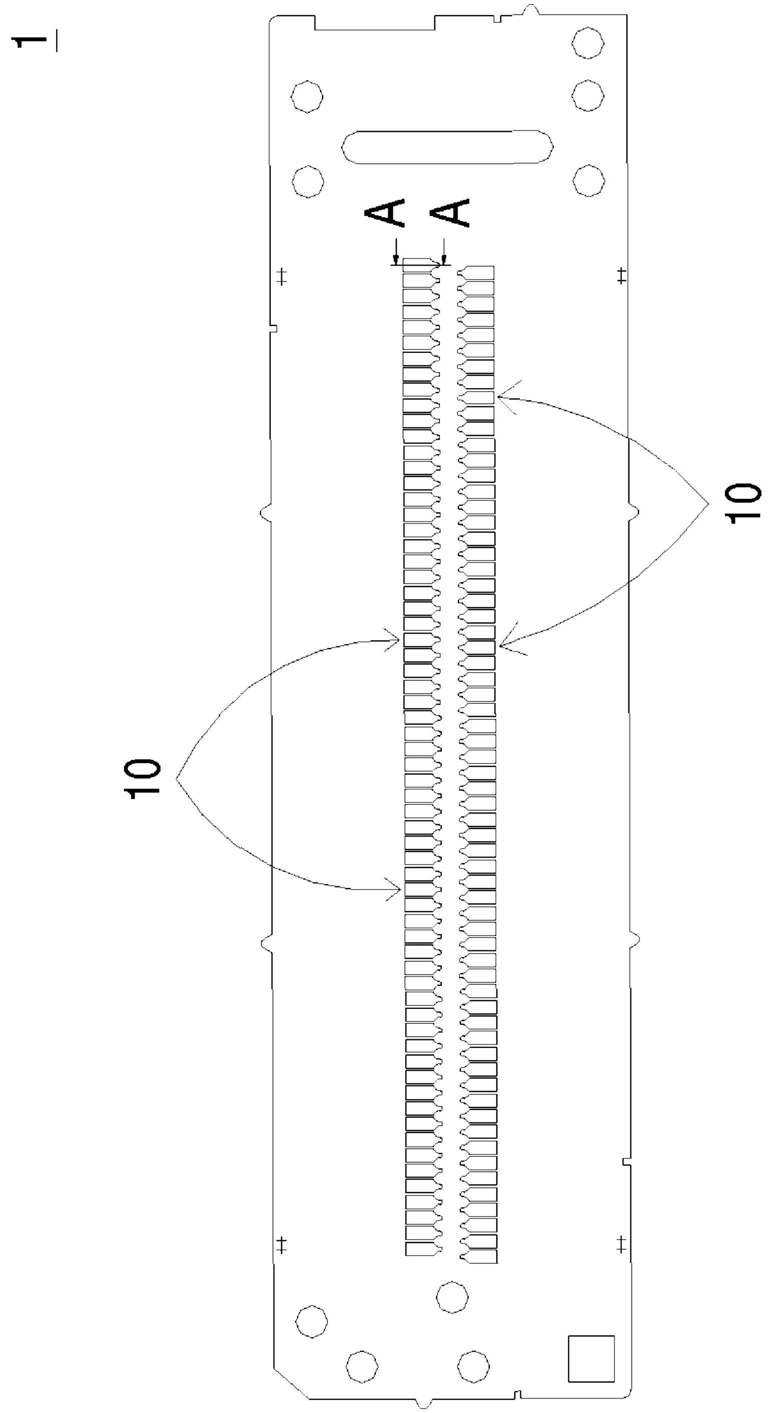
FIG. 1A PRIOR ART
FIG. 1A schematically illustrates a multilayered structure of a conventional inkjet head.
Figure 1B:
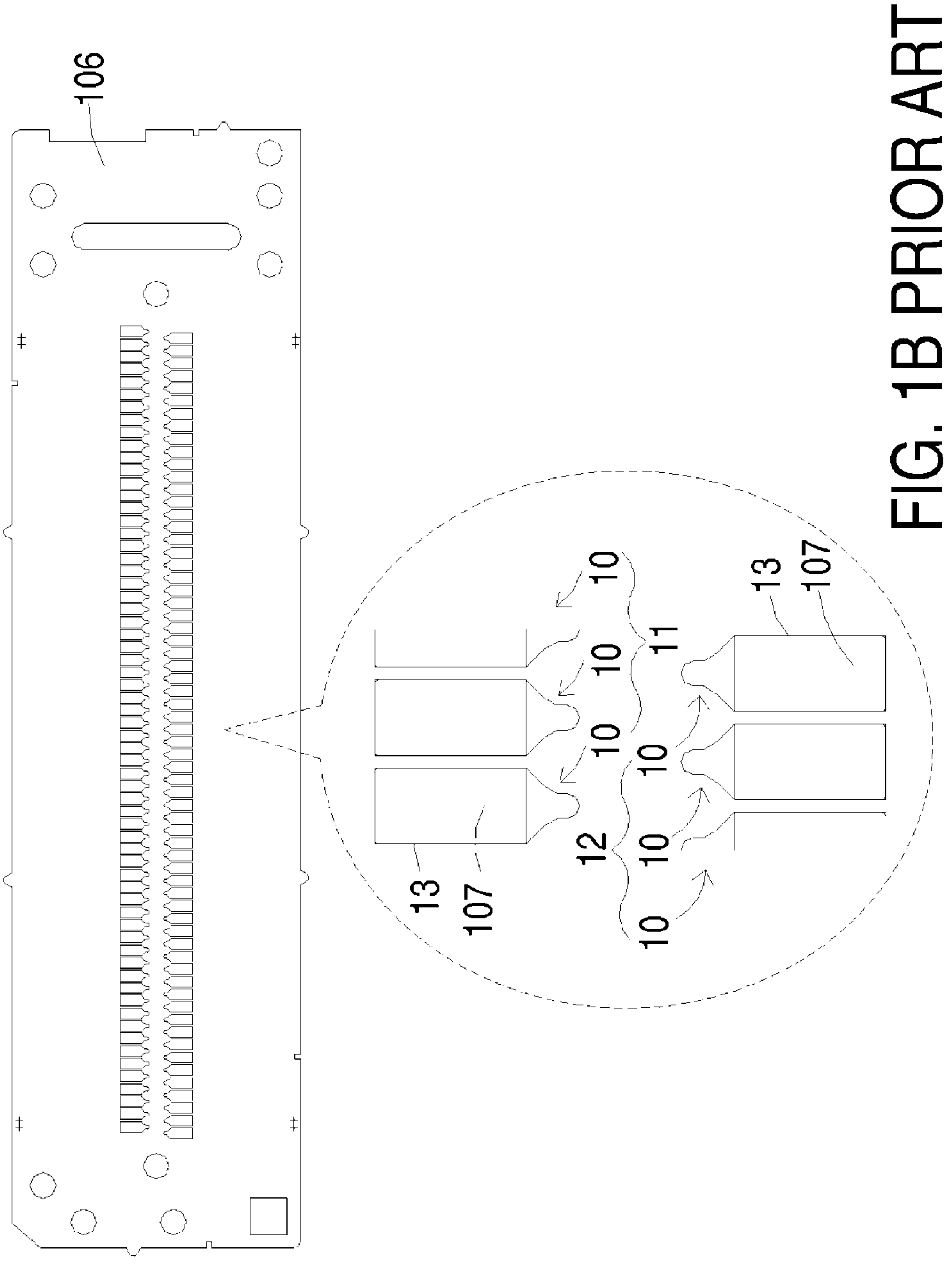
FIG. 1B PRIOR ART
FIG. 1B is a schematic partially enlarged view illustrating the multilayered structure of the inkjet head as shown in FIG. 1A.
Figure 1C:
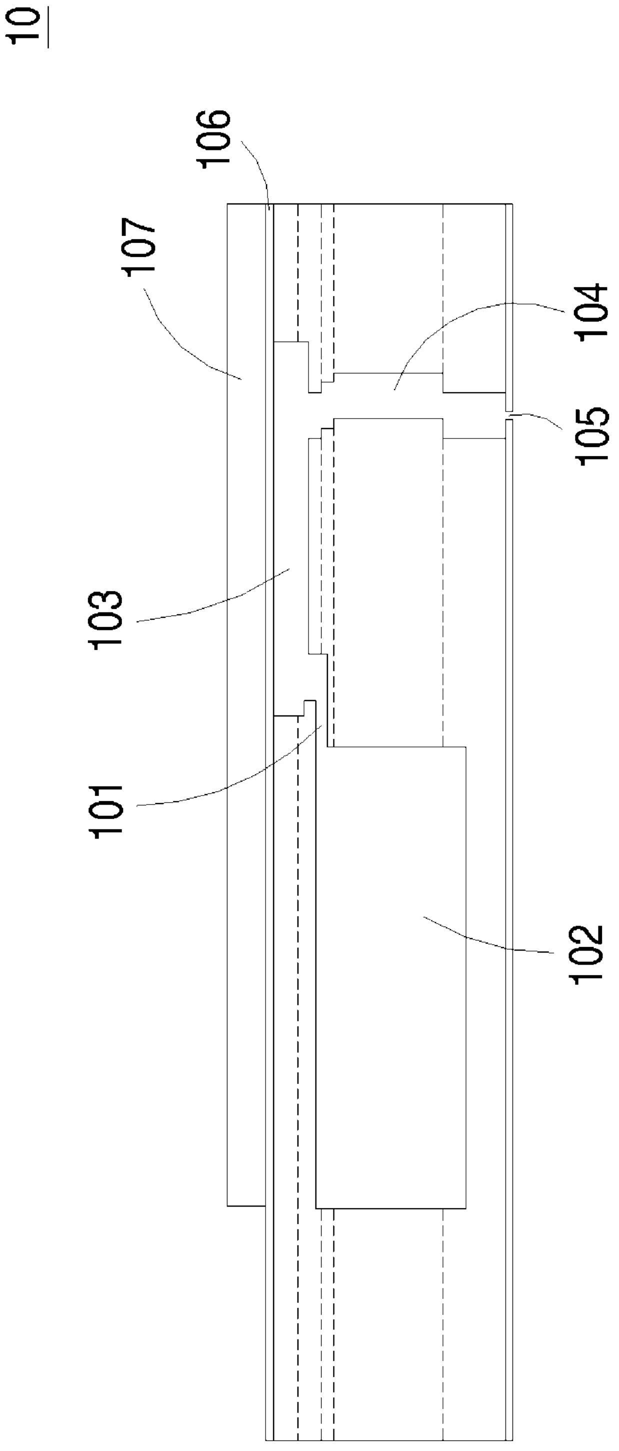
FIG. 1C PRIOR ART
FIG. 1C is a schematic cross-sectional view illustrating the multilayered structure of FIG. 1A and taken along the line A-A.
Figure 1D:
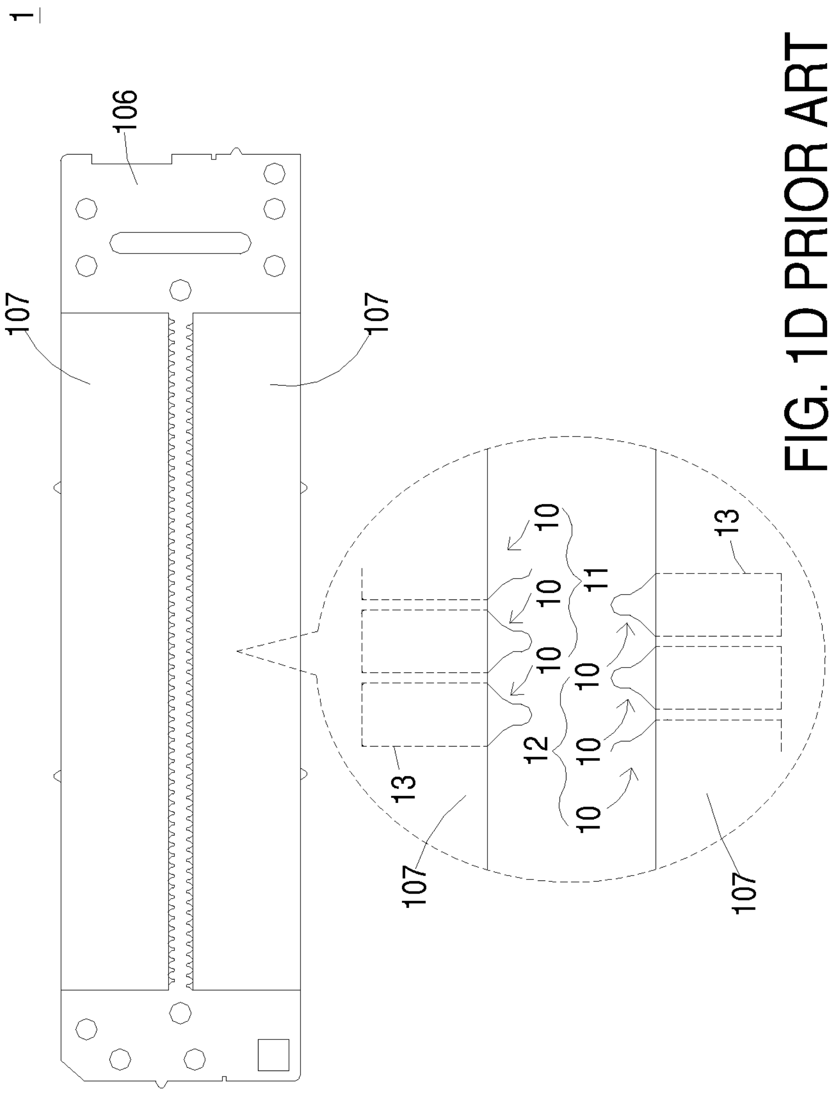
FIG. 1D PRIOR ART
FIG. 1D schematically illustrates a multilayered structure of a conventional inkjet head before a laser cutting process is performed.
Figure 6:
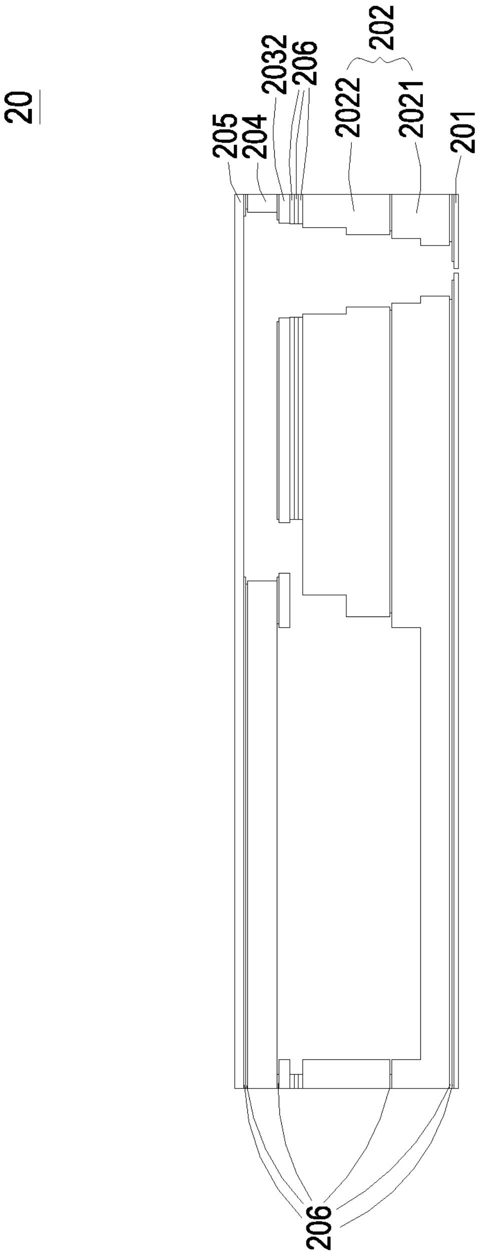
FIG. 6 schematically illustrates an inkjet head structure according to a fourth embodiment of the present invention.

FIG. 6 schematically illustrates an inkjet head structure according to a fourth embodiment of the present invention. For comparing the inkjet head structure of this embodiment with the multilayered structure of FIG. 2B, the actuator plate is not shown. In comparison with the inkjet unit 20 of FIG. 4, the inlet flow layer 2031 is replaced by the multilayered dry film layer 206. Consequently, the layer number of the inkjet unit 20 may be reduced to 6. For preventing the thickness deviation of the inkjet unit 20 in comparison with the inkjet unit 20 of FIG. 1C, the dry film layer 206 used in the inkjet unit 20 of FIG. 4 or 5 is as thin as possible. However, if the inlet flow layer 2031 of FIG. 4 is replaced by the thin dry film layer 206, so many dry film layers 206 are necessary. As known, it is time-consuming to install so many dry film layers 206. In this embodiment of FIG. 6, the inlet flow layer 2031 is replaced by the three layers of dry film layers 206, wherein the thickness of each dry film layer 206 is 30 micrometer. Alternatively, the inlet flow layer 2031 is replaced by the two layers of dry film layers 206, wherein one dry film layer 206 has a thickness of 30 micrometer, and the other dry film layer 206 has a thickness of 50 micrometer. In some other embodiments, different layer number of dry film layers with different thicknesses may be used to replace the inlet flow layer 2031.

Figure 7:
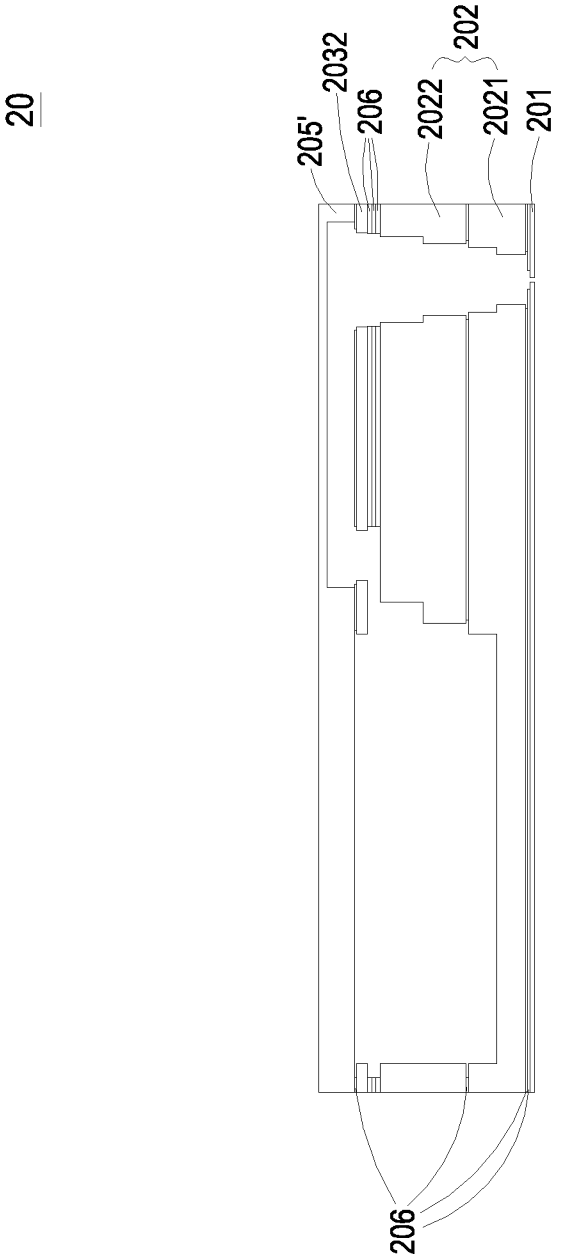
FIG. 7 schematically illustrates an inkjet head structure according to a fifth embodiment of the present invention.

FIG. 7 schematically illustrates an inkjet head structure according to a fifth embodiment of the present invention. For comparing the inkjet head structure of this embodiment with the multilayered structure of FIG. 2B, the actuator plate is not shown. In comparison with FIG. 5, the pressure cavity layer 204 and the actuator layer 205 of the inkjet unit 20 of this embodiment are consolidated into a single actuator layer 205'. Consequently, the layer number of the inkjet unit 20 may be reduced to 5.

From the above description, the multilayered structure of the inkjet head of the present invention is assembled and positioned through the dry film layers by a thermal compression process in replace of the conventional metal fusion bonding process. Since the dry film layers are used as the gluing layers, the metal plates of all layers are not necessarily plated with gold, and the fabricating cost is largely reduced. Moreover, since the multilayered structure is assembled by the simple thermal compression equipment and in batch-wise manner, the production is more efficiency. Since the areas of the outlet flow channel are gradually reduced in the direction from the pressure cavity to the nozzle hole, the tapered flow channel structure of the outlet flow channel may guide the ink liquid along a flowing direction at an accelerated flow speed. Due to the tapered flow channel structure of the outlet flow channel, uniformly-sized ink droplets of the ink liquid can be quickly ejected out of the nozzle hole. Moreover, since the alignment check holes of different microstructure layers are concentric and have different diameters, the alignment check holes are utilized to assist in alignment. In such way, after these microstructure layers are stacked together, the misalignment problem will be avoided, and thus the inkjet unit can maintain the normal inkjet function. Moreover, since the pressure cavities of the plurality of inkjet units are symmetrical and parallel with each other, the cutting process may be performed by using a cutting knife to linearly cut the actuator plate. In comparison with the laser cutting process, the cutting process of the present invention is time-saving and precisely controlled because it is not necessary to preset the laser cutting parameters before the cutting process is performed. Moreover, the cutting machine used in the present invention is more cost-effective than the conventional laser machine. In other words, the inkjet head manufacturing method of the present invention is more advantageous.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An inkjet head manufacturing method, comprising steps:

(a) providing a multilayered structure with a plurality of microstructure layers, wherein a plurality of slots and a plurality of alignment check holes are formed in each microstructure layer, wherein said alignment check holes of said microstructure layers are concentric and have different diameters;

(b) stacking said microstructure layers together and aligning said microstructure layers with each other according to said concentric and different-diameter alignment check holes, wherein a dry film layer is sandwiched between every two adjacent microstructure layers, wherein said preset slots of said microstructure layers are collectively defined as inlet flow channels, ink chambers, pressure cavities and outlet flow channels, wherein said pressure cavities are symmetrical and parallel with each other;

(c) fixing said aligned multilayered structure by a heating jig, and assembling and positioning said multilayered structure through said dry film layers by a thermal compression process;

(d) attaching an actuator plate on said multilayered structure at positions corresponding to said symmetrical and parallel pressure cavities, and using a cutting knife to linearly cut said actuator plate over a spacer between every two adjacent pressure cavities and along a path parallel with rims of said pressure cavities, thereby producing an inkjet head with a plurality of symmetrical inkjet units.

2. The inkjet head manufacturing method according to claim 1 wherein in said step (b), said dry film layer is made of acrylic resin or epoxy resin.

3. The inkjet head manufacturing method according to claim 1 wherein in said step (b), said multilayered structure comprises a nozzle hole layer, an intermediate flow channel layer, a communication layer, a pressure cavity layer and an actuator layer, which are sequentially stacked, wherein a dry film layer is sandwiched between every two adjacent layers of said multilayered structure.

4. The inkjet head manufacturing method according to claim 3 wherein said nozzle hole layer has a nozzle hole in communication with a corresponding outlet flow channel.

5. The inkjet head manufacturing method according to claim 3 wherein said intermediate flow channel layer comprises a plurality of plates, which are stacked together, wherein a dry film layer is sandwiched between every two adjacent plates of said intermediate flow channel layer.

6. The inkjet head manufacturing method according to claim 3 wherein said communication layer comprises an inlet flow layer and a communication hole layer, which are stacked together, wherein a dry film layer is sandwiched between said inlet flow layer and said communication hole layer.

7. The inkjet head manufacturing method according to claim 3 wherein said actuator layer comprises a vibration film plate, wherein said pressure cavity layer with said preset slots is capped by said vibration film plate, thereby forming a sealed pressure cavity.

8. The inkjet head manufacturing method according to claim 3 wherein said outlet flow channels are define by said intermediate flow channel layer and said communication layer, wherein an area of said outlet flow channel is gradually decreased along a tapered direction, wherein along said tapered direction, a flow channel area of an upstream microstructure layer is larger than a flow channel area of an adjacent downstream microstructure layer, so that outlet flow channel has a tapered flow channel structure.

9. The inkjet head manufacturing method according to claim 7 wherein said vibration film plate is attached on said actuator plate, so that said vibration film plate and said actuator plate are collectively defined as said actuator layer, wherein by changing an electric field applied to said actuator plate, said vibration film plate is correspondingly moved, and the volume of said pressure cavity is correspondingly changed.

10. The inkjet head manufacturing method according to claim 1 wherein said actuator plate is made of piezoelectric material such as lead zirconate titanate (PZT).

* * * * *